(12) United States Patent
Mizusako et al.

(10) Patent No.: US 8,040,930 B2
(45) Date of Patent: Oct. 18, 2011

(54) DRIVE CIRCUIT FOR SEMICONDUCTOR LIGHT EMITTING ELEMENT, AND LIGHT SOURCE DEVICE, LIGHTING DEVICE, MONITOR DEVICE, AND IMAGE DISPLAY DEVICE USING THE DRIVE CIRCUIT

(75) Inventors: Kazuhisa Mizusako, Chino (JP); Kiyoto Sudo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 453 days.

(21) Appl. No.: 12/189,930

(22) Filed: Aug. 12, 2008

(65) Prior Publication Data
US 2009/0059981 A1   Mar. 5, 2009

(30) Foreign Application Priority Data
Aug. 31, 2007   (JP) .................................. 2007-226388

(51) Int. Cl.
*H01S 3/00* (2006.01)
*H05K 1/14* (2006.01)

(52) U.S. Cl. .................... 372/38.02; 372/38.1; 361/736; 361/748

(58) Field of Classification Search ............... 372/38.02; 361/736
See application file for complete search history.

(56) References Cited

U.S. PATENT DOCUMENTS

| | | | | |
|---|---|---|---|---|
| 6,021,223 | A * | 2/2000 | Toyoda et al. | 382/214 |
| 6,292,500 | B1 * | 9/2001 | Kouchi et al. | 372/38.1 |
| 6,518,502 | B2 * | 2/2003 | Hammond et al. | 174/535 |
| 6,740,963 | B2 | 5/2004 | Kaneko et al. | |
| 7,300,182 | B2 * | 11/2007 | Mazzochette | 362/294 |
| 2003/0057421 | A1 * | 3/2003 | Chen | 257/79 |
| 2003/0179558 | A1 * | 9/2003 | Giaretta et al. | 361/777 |
| 2006/0278881 | A1 * | 12/2006 | Yamazaki | 257/98 |
| 2007/0041199 | A1 * | 2/2007 | Okada et al. | 362/326 |
| 2007/0295975 | A1 * | 12/2007 | Omae | 257/89 |
| 2009/0241312 | A1 * | 10/2009 | Kunimatsu et al. | 29/25.03 |

FOREIGN PATENT DOCUMENTS

| | | |
|---|---|---|
| JP | A-63-260465 | 10/1988 |
| JP | A-05-095148 | 4/1993 |
| JP | A-2002-335034 | 11/2002 |
| JP | A-2007-207803 | 8/2007 |

* cited by examiner

Primary Examiner — Jessica Stultz
Assistant Examiner — Phillip Nguyen
(74) Attorney, Agent, or Firm — Oliff & Berridge PLC

(57) ABSTRACT

A drive circuit for driving a semiconductor light emitting element includes a board, a first pattern formed in a first layer of the board so as to be electrically connected to an anode of the semiconductor light emitting element, and a second pattern formed in a second layer of the board so as to be electrically connected to a cathode of the semiconductor light emitting element, and the first pattern and the second pattern are formed so as to overlap with each other when viewed in a direction along a normal line of the board.

15 Claims, 13 Drawing Sheets

FIG. 6A   OBVERSE SURFACE
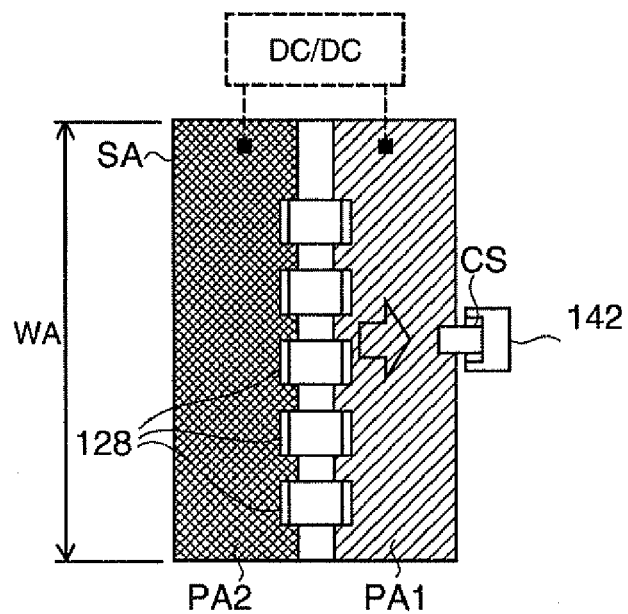
FIG. 6B   CROSS-SECTIONAL VIEW
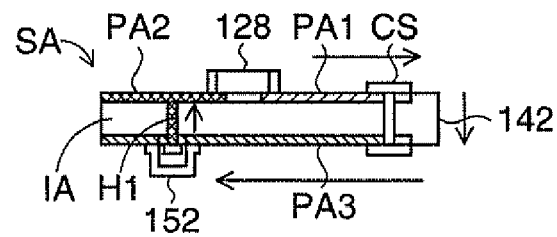
FIG. 6C   REVERSE SURFACE
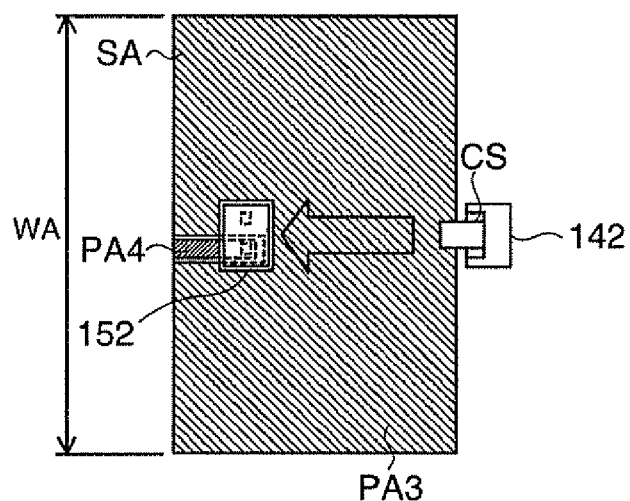

FIG. 8A  OBVERSE SURFACE
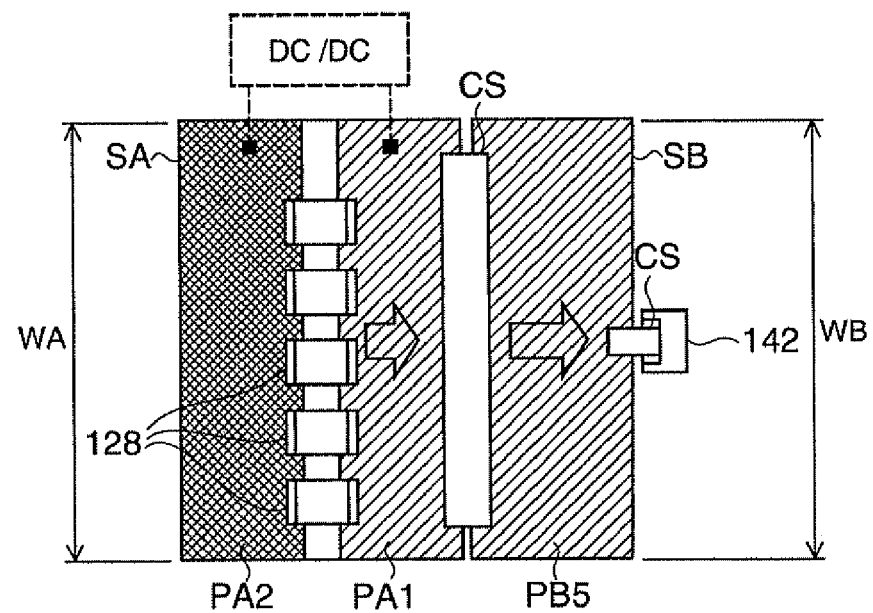
FIG. 8B  CROSS-SECTIONAL VIEW
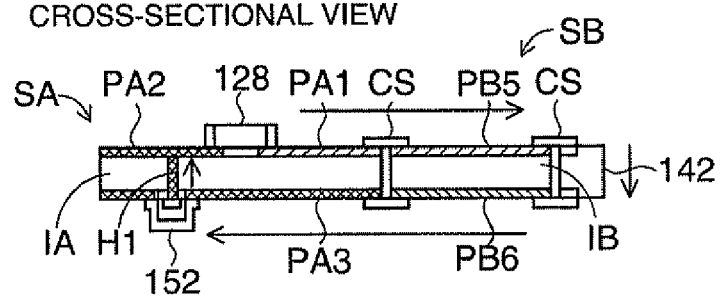
FIG. 8C  REVERSE SURFACE
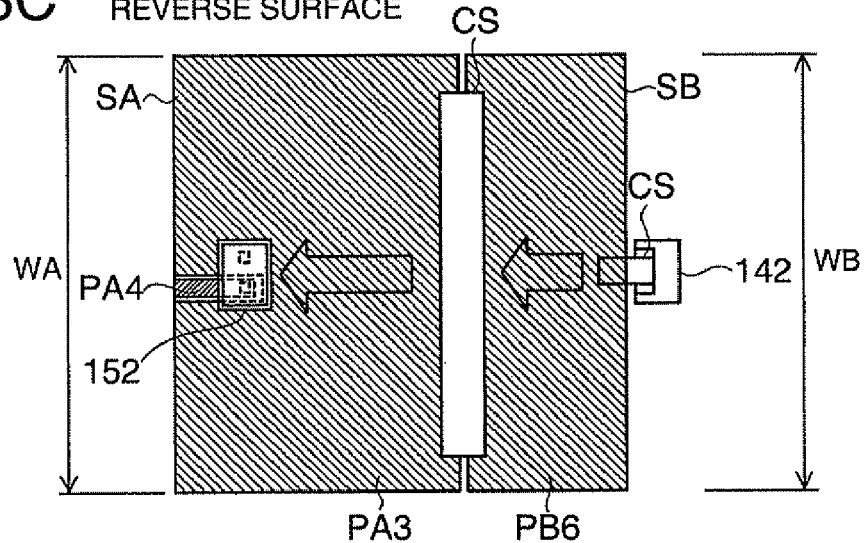

FIG. 9A   OBVERSE SURFACE
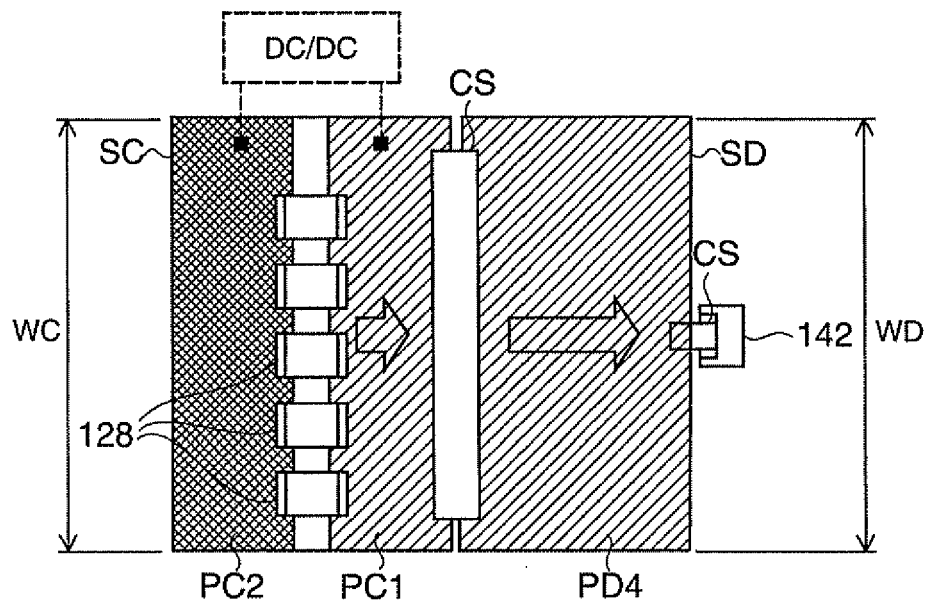
FIG. 9B   CROSS-SECTIONAL VIEW
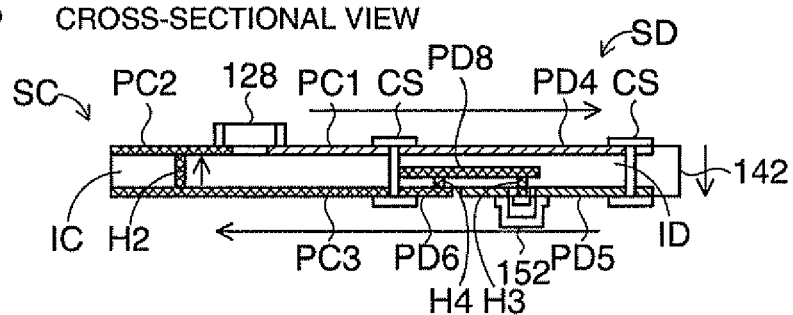
FIG. 9C   REVERSE SURFACE
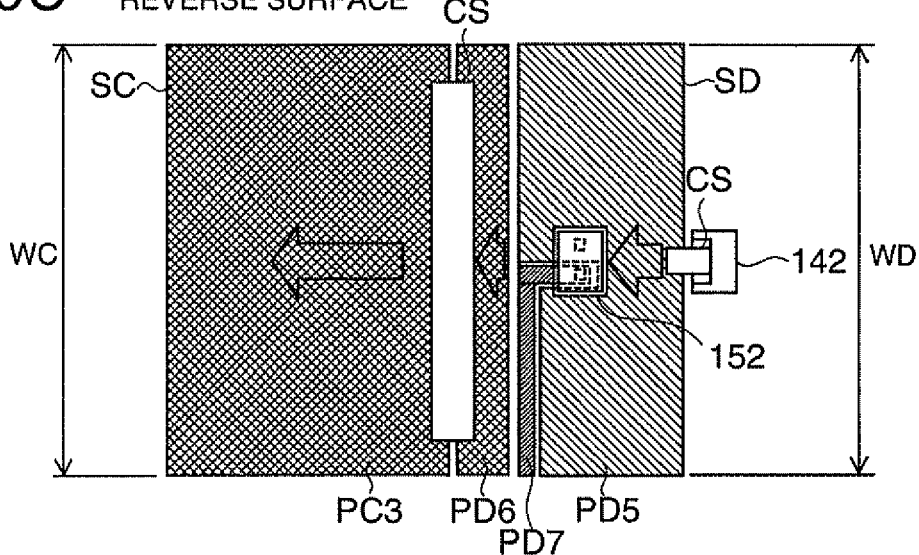

DRIVE CIRCUIT FOR SEMICONDUCTOR LIGHT EMITTING ELEMENT, AND LIGHT SOURCE DEVICE, LIGHTING DEVICE, MONITOR DEVICE, AND IMAGE DISPLAY DEVICE USING THE DRIVE CIRCUIT

BACKGROUND

1. Technical Field

The present invention relates to a drive circuit for driving a semiconductor light emitting element.

2. Related Art

Light source devices are each provided with, for example, a semiconductor laser and a drive circuit for driving the semiconductor laser, JP-A-5-95148 discloses such a light source device.

Incidentally, it is preferable that a light source device such as a semiconductor laser has high efficiency. However, the drive circuit commonly has a parasitic inductance. The influence of the parasitic inductance becomes significant in the case in which the current flowing through the semiconductor laser is large, and the amount of the current flowing through the semiconductor laser varies. Therefore, in the related art, it is difficult to sufficiently increase the efficiency of the light source device because of parasitic inductance of the drive circuit.

It should be noted that the problem occurs not only in the case in which the light source device is provided with the semiconductor laser, but also in the case in which the light source device is provided with a semiconductor light emitting element such as an LED.

SUMMARY

An advantage of some aspects of the invention is reduce the parasitic inductance of the drive circuit for driving the semiconductor light emitting element.

The invention has an advantage of solving at least a part of the problem described above, and can be realized as following aspects or application examples.

APPLICATION EXAMPLE 1

A drive circuit for driving a semiconductor light emitting element includes a board, a first pattern formed in a first layer of the board so as to be electrically connected to an anode of the semiconductor light emitting element, and a second pattern formed in a second layer of the board so as to be electrically connected to a cathode of the semiconductor light emitting element, and the first pattern and the second pattern are formed so as to overlap with each other when viewed in a direction along a normal line of the board.

Since in this drive circuit, the first pattern in the first layer of the board and the second pattern in the second layer of the board are formed so as to overlap with each other when viewed in a direction along a normal line of the board, it is possible to reduce the parasitic inductance of the drive circuit.

APPLICATION EXAMPLE 2

In the drive circuit according to the application example 1, a width of the first pattern and a width of the second pattern are substantially the same.

According to this configuration, the parasitic inductance can be reduced compared to the case in which the width of the first pattern and the width of the second pattern are different from each other.

APPLICATION EXAMPLE 3

In the drive circuit according to one of the application examples 1 and 2, a first direction in which a current flowing through the semiconductor light emitting element flows through the first pattern and a second direction in which the current flows through the second pattern are reverse to each other.

APPLICATION EXAMPLE 4

In the drive circuit according to any one of the application examples 1 through 3, the board is formed of a rigid board.

APPLICATION EXAMPLE 5

In the drive circuit according to the application example 4, the semiconductor light emitting element is allowed to be disposed on a side of the rigid board.

According to this configuration, the parasitic inductance can be reduced compared to the case in which the semiconductor light emitting element is disposed on one of the surfaces of the rigid board.

APPLICATION EXAMPLE 6

In the drive circuit according to the application example 4, there are further provided a flexible board, a third pattern formed in a third layer of the flexible board, and through which the first pattern and the anode are to be electrically connected to each other, and a fourth pattern formed in a fourth layer of the flexible board, and through which the second pattern and the cathode are to be electrically connected to each other, and the third pattern and the fourth pattern are formed so as to overlap with each other when viewed in a direction along a normal line of the flexible board.

According to this configuration, the freedom of arrangement of the drive circuit can be enhanced.

APPLICATION EXAMPLE 7

In the drive circuit according to the application example 6, a width of the third pattern and a width of the fourth pattern are substantially the same.

APPLICATION EXAMPLE 8

In the drive circuit according to one of the application examples 6 and 7, a third direction in which a current flowing through the semiconductor light emitting element flows through the third pattern and a fourth direction in which the current flows through the fourth pattern are reverse to each other.

APPLICATION EXAMPLE 9

In the drive circuit according to any one of the application examples 6 through 8, the semiconductor light emitting element is allowed to be disposed on a side of the flexible board.

According to this configuration, the parasitic inductance can be reduced compared to the case in which the semiconductor light emitting element is disposed on one of the surfaces of the flexible board.

APPLICATION EXAMPLE 10

In the drive circuit according to any one of the application examples 4 through 9, there is further provided a switching element to be connected to the semiconductor light emitting element, and the switching element is disposed inside an area in which the second pattern is formed.

APPLICATION EXAMPLE 11

In the drive circuit according to any one of the application examples 1 through 3, the board is formed of a flexible board.

According to this configuration, the freedom of arrangement of the drive circuit can be enhanced.

APPLICATION EXAMPLE 12

In the drive circuit according to the application example 11, the semiconductor light emitting element is allowed to be disposed on a side of the flexible board.

According to this configuration, the parasitic inductance can be reduced compared to the case in which the semiconductor light emitting element is disposed on one of the surfaces of the flexible board.

APPLICATION EXAMPLE 13

In the drive circuit according to one of the application examples 11 and 12, there is further provided a switching element to be connected to the semiconductor light emitting element, and the switching element is disposed inside an area in which the second pattern is formed.

APPLICATION EXAMPLE 14

A light source device includes the drive circuit according to any one of the application examples 1 through 13 and the semiconductor light emitting element.

APPLICATION EXAMPLE 15

A lighting device includes the light source device according to the application example 14.

APPLICATION EXAMPLE 16

A monitor device includes the light source device according to the application example 14, and an imaging section for shooting an object lighted by the light source device.

APPLICATION EXAMPLE 17

An image display device includes the light source device according to the application example 14, and a light modulation device for modulating the light emitted from the light source device in accordance with image information.

It should be noted that the invention can be put into practice in various forms such as a drive circuit, or a light source device, a lighting device, a monitor device, an image display device, and a projector each equipped with the drive circuit.

BRIEF DESCRIPTION OF THE DRAWINGS

The invention will now be described with reference to the accompanying drawings, wherein like numbers reference like elements.

FIGS. 6A through 6C are explanatory diagrams showing a configuration of a printed circuit board.

FIGS. 8A through 8C are explanatory diagrams showing a configuration of a printed circuit board in a second embodiment of the invention.

FIGS. 9A through 9C are explanatory diagrams showing a configuration of a printed circuit board in a third embodiment of the invention.

DESCRIPTION OF EXEMPLARY EMBODIMENTS

Some embodiments of the invention will hereinafter be explained based on some specific examples in the following order.

Figure 1:
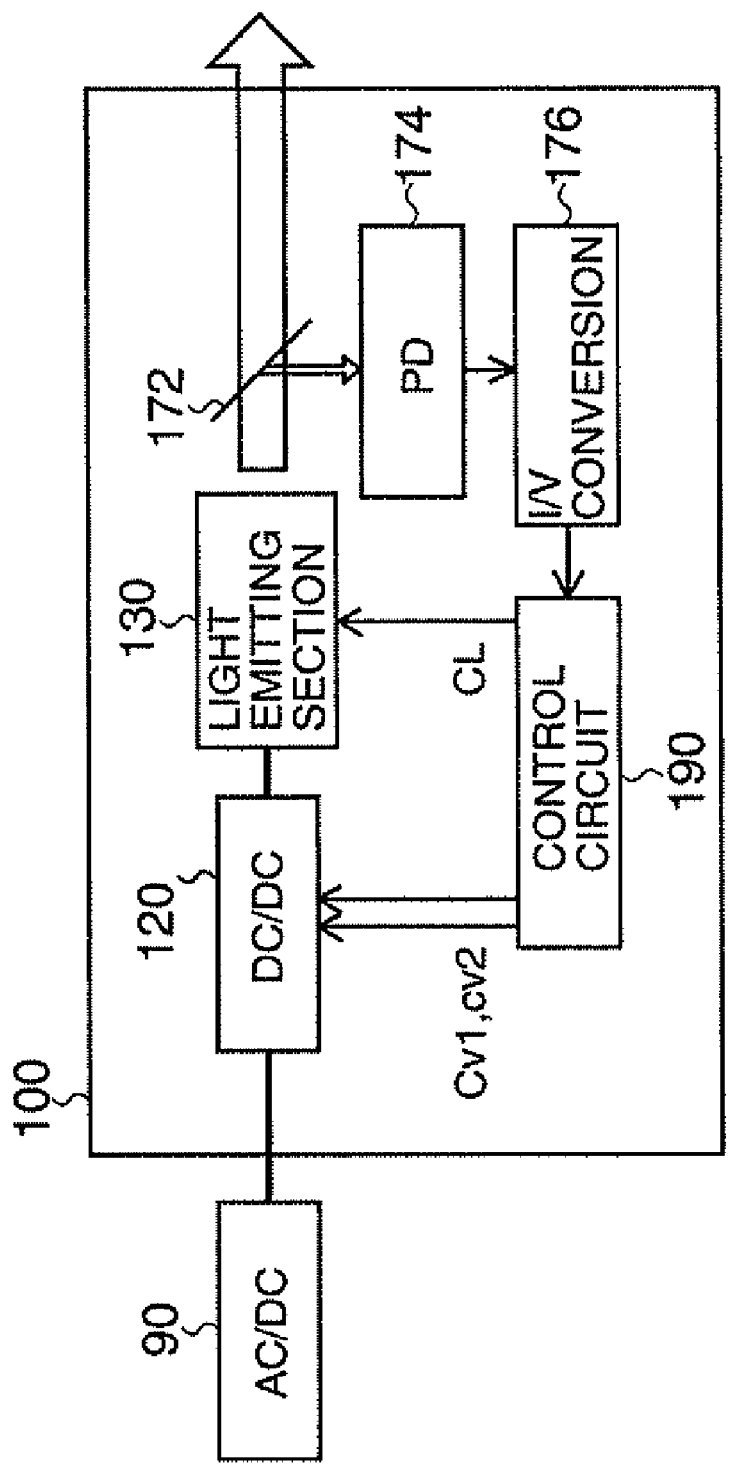
FIG. 1 is an explanatory diagram showing a schematic configuration of a light source device 100.
Figure 2:
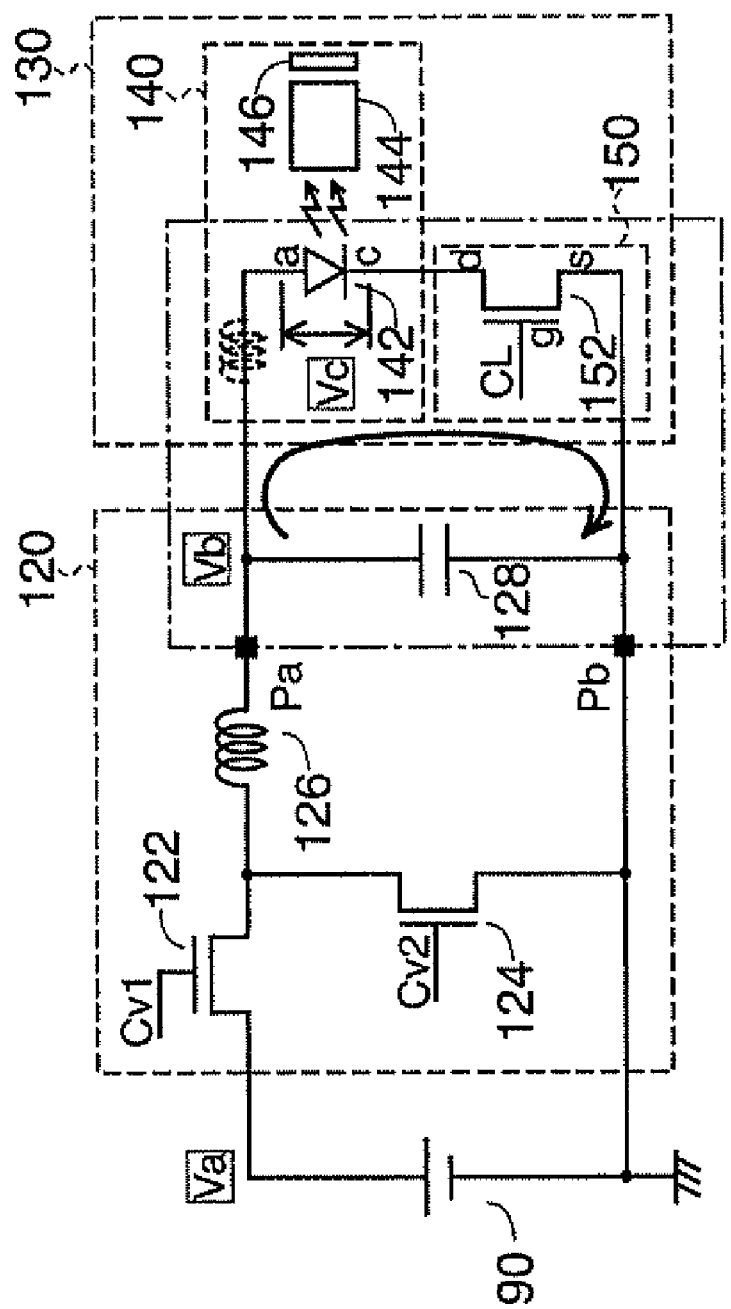
FIG. 2 is an explanatory diagram showing inside configurations of a DC/DC converter 120 and a light emitting section 130 shown in FIG. 1.

A. First Embodiment
A-1. Configuration of Light Source Device
A-2. Influence of Parasitic Inductance
A-3. Configuration of Print Circuit Board
B. Second Embodiment
C. Third Embodiment
C-1. Modified Example of Third Embodiment
D. Application Examples of Light Source Device A. First Embodiment A-1. Configuration of Light Source Device FIG. 1 is an explanatory diagram showing a schematic configuration of a light source device 100. It should be noted that FIG. 1 also shows an AC/DC converter 90 for supplying power to the light source device 100. As shown in the drawing, the light source device 100 is provided with a DC/DC converter 120, a light emitting section 130, a detecting mirror 172, a photo diode (PD) 174, a current/voltage (I/V) conversion circuit 176, and a control circuit 190. FIG. 2 is an explanatory diagram showing inside configurations of a DC/DC converter 120 and a light emitting section 130 shown in FIG. 1. Hereinafter, the light source device 100 will be explained with reference to FIGS. 1 and 2.

The DC/DC converter 120 receives a first direct-current voltage from the AC/DC converter 90, and lowers the voltage value of the first direct-current voltage to output a second direct-current voltage.

Specifically, as shown in FIG. 2, the DC/DC converter 120 is provided with two transistors 122, 124, an inductor 126, and a capacitor 128. The first transistor 122, the inductor 126, and the capacitor 128 are connected in series in this order. Further, the second transistor 124 is connected to the inductor 126 and the capacitor 128 in parallel.

The gate terminal of the first transistor 122 is supplied with a first voltage control signal Cv1. Further, the gate terminal of the second transistor 124 is supplied with a second voltage control signal Cv2. The two transistors 122, 124 are alternately set to an ON state or an OFF state in accordance with the two voltage control signals Cv1, Cv2, respectively. The inductor 126 and the capacitor 128 smoothes output voltage between the two transistors 122, 124. According to this configuration, the DC/DC converter 120 can lower the first direct-current voltage received from the AC/DC converter 90 to output the second direct-current voltage.

As shown in FIG. 2, the light emitting section 130 is provided with a light emitting device 140 and a switching circuit 150. The light emitting device 140 is provided with a semiconductor laser 142 for emitting a fundamental wave (an infrared beam), a wavelength conversion element 144 for generating a second harmonic wave using a second harmonic wave generation (SHG) phenomenon, and a mirror 146 forming an external resonator, and emits visible light. Further, the switching circuit 150 is provided with a transistor 152 for setting the semiconductor laser 142 to an emission state or a non-emission state.

The detecting mirror 172 guides a part (monitor light) of the light emitted from the light emitting device 140 to the photo diode 174. A current corresponding to the intensity of the monitor light flows through the photo diode 174. The current/voltage conversion circuit 176 outputs a voltage corresponding to the current flowing through the photo diode 174.

The control circuit 190 supplies the DC/DC converter 120 with the two voltage control signals Cv1, Cv2 in accordance with the output value (voltage value) of the current/voltage conversion circuit 176. Specifically, the control circuit 190 changes the duty ratio of the first voltage control signal Cv1 and the duty ratio of the second voltage control signal Cv2 in accordance with the output value of the current/voltage conversion circuit 176. For example, when the output value of the current/voltage conversion circuit 176 is lower than a target value, the duty ratio of the first voltage signal Cv1 is increased, and at the same time, the duty ratio of the second voltage control signal Cv2 is decreased. As a result, the DC/DC converter 120 can output the second direct-current voltage having the value corresponding to the two voltage control signals Cv1, Cv2.

Further, the control circuit 190 supplies the light emitting section 130 with a light emission control signal CL. When the transistor 152 is set to the ON state or the OFF state in accordance with the light emission control signal CL, the semiconductor laser 142 is set to the emission state or the non-emission state, respectively. The semiconductor laser 142 emits the infrared light having intensity corresponding to the second direct-current voltage, and as a result, the light emitting device 140 emits the visible light having intensity corresponding to the second direct-current voltage.

As is understood from the above explanation, in the light source device 100 of the present embodiment, automatic power control (APC) control is performed so as to keep the intensity of the visible light emitted from the light emitting device 140 substantially constant.

It should be noted that a part of the light source device 100 shown in FIGS. 1 and 2 excluding the light emitting device 140 corresponds to the drive circuit of the invention. Further, the semiconductor laser 142 included in the light emitting device 140 corresponds to the semiconductor light emitting element of the invention.

Figure 3A:
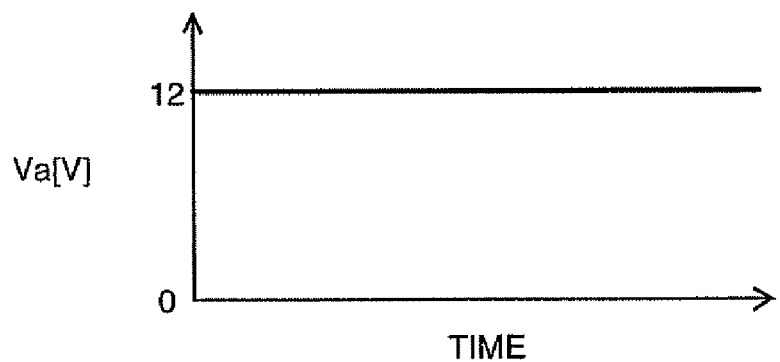
FIGS. 3A through 3C are explanatory diagrams schematically showing a voltage variation in a circuit shown in FIG. 2.
Figure 3B:
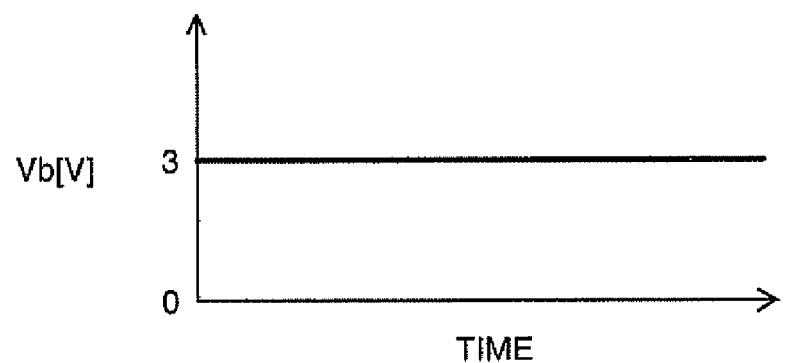
Figure 3C:
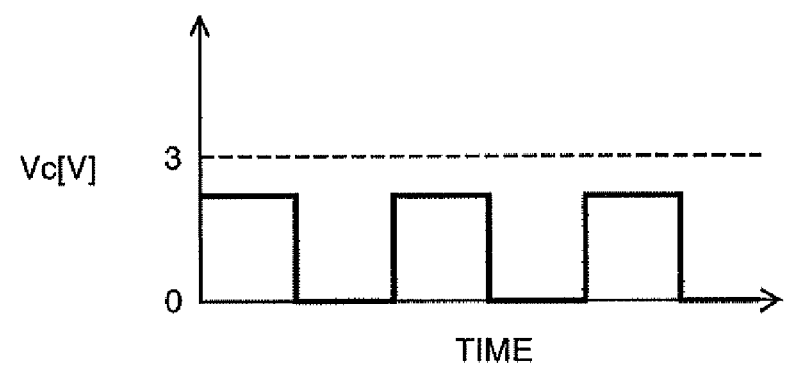

FIGS. 3A through 3C are explanatory diagrams schematically showing a voltage variation in a circuit shown in FIG. 2. FIGS. 3A through 3C respectively show variations in three voltages Va through Vc shown in FIG. 2. The voltage Va is an input voltage (i.e., the output voltage of the AC/DC converter 90) of the DC/DC converter 120. The voltage Vb is an output voltage of the DC/DC converter 120. The voltage Vc is an inter-terminal voltage, namely a voltage between the anode and the cathode of the semiconductor laser 142.

In the present embodiment, as shown in FIG. 3A, the DC/DC converter 120 receives the direct-current voltage of about 12V. Further, as shown in FIG. 3B, the DC/DC converter 120 outputs the direct-current voltage of about 3V. Then, as shown in FIG. 3C, between the anode and the cathode of the semiconductor laser 142, there is periodically applied a voltage in accordance with the periodic light emission control signal CL. It should be noted that during the term in which the transistor 152 is set to the ON state, a current flows through the semiconductor laser 142 to cause a significant voltage between the anode and cathode of the semiconductor laser 142.

A-2. Influence of Parasitic Inductance

Incidentally, FIG. 2 shows an inductance with a broken line. As shown in the drawing, in the actual drive circuit, there is a parasitic inductance caused by a wiring pattern, specifically by a current loop shown in FIG. 2.

Figure 4:
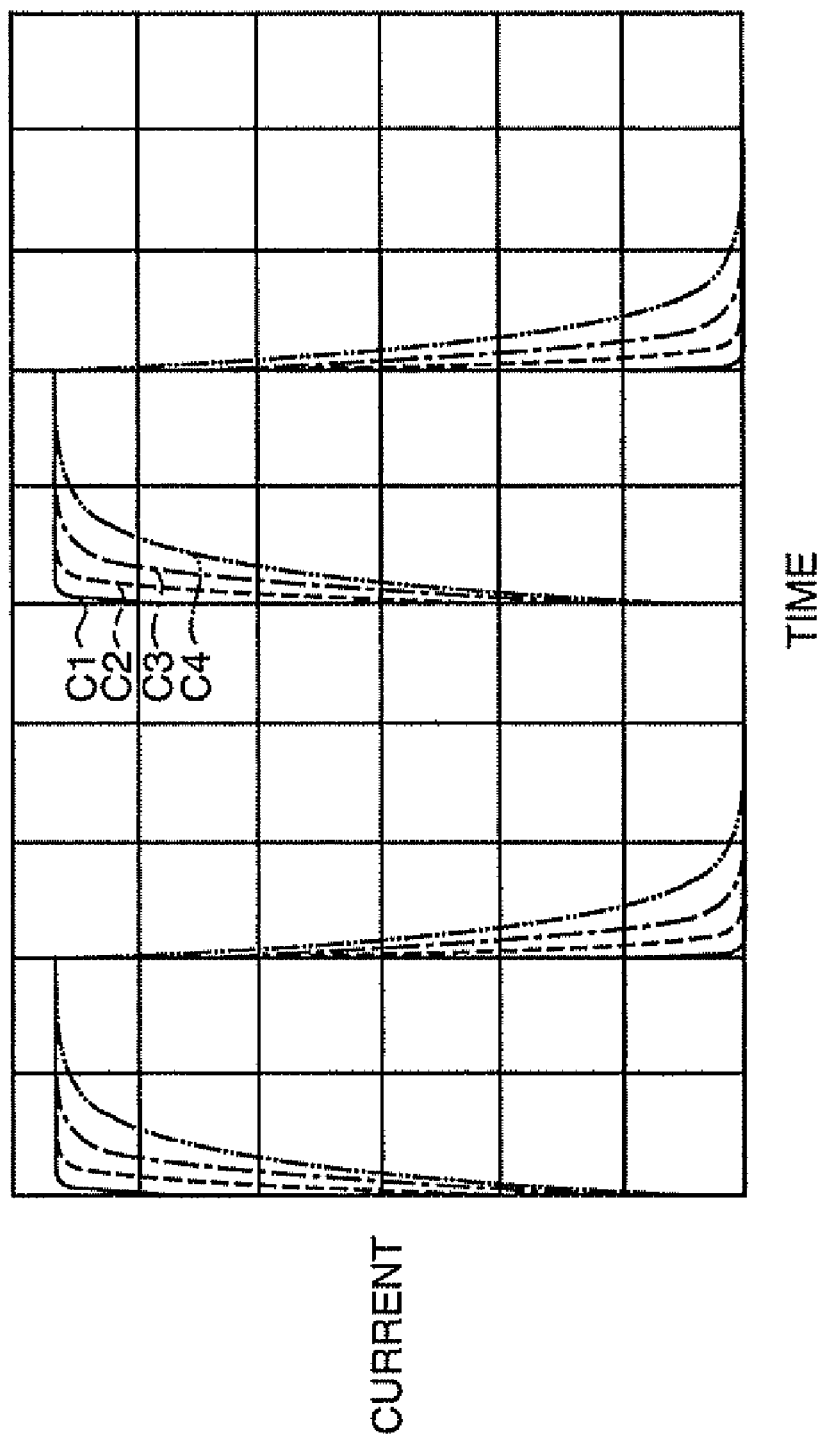
FIG. 4 is an explanatory diagram showing a waveform of a current corresponding to a parasitic inductance.

FIG. 4 is an explanatory diagram showing a waveform of a current corresponding to a parasitic inductance. In the drawing, the lateral axis represents time while the vertical axis represents the current flowing through the anode and the cathode of the semiconductor laser 142. The curved lines C1 through C4 illustrate waveforms of the currents corresponding respectively to the parasitic inductance values of 10 nH, 15 nH, 32 nH, and 60 nH.

As is understood from FIG. 4, in the case in which the parasitic inductance is relatively small, the waveform of the current comes closer to a rectangular wave. In contrast, in the case in which the parasitic inductance is relatively large, the waveform of the current becomes dull. This is because the parasitic inductance acts so as to interfere the change in the current when the pulse current flows through the semiconductor laser 142.

The light emission intensity LP of the semiconductor laser 142 can be represented as follows using power (supply power) IP supplied to the semiconductor laser and light conversion efficiency η of the semiconductor laser.

$$LP = IP \times \eta$$

Further, the supply power IP can be represented as follows using a peak value (a peak voltage) Vp of the voltage applied between the anode and the cathode of the semiconductor laser and an integration value ∫I of the current flowing through the semiconductor laser.

$$IP = Vp \times \int I$$

Since in the case in which the waveform of the current is dull, the integration value ∫I is reduced, the supply power IP is also reduced.

Figure 5:
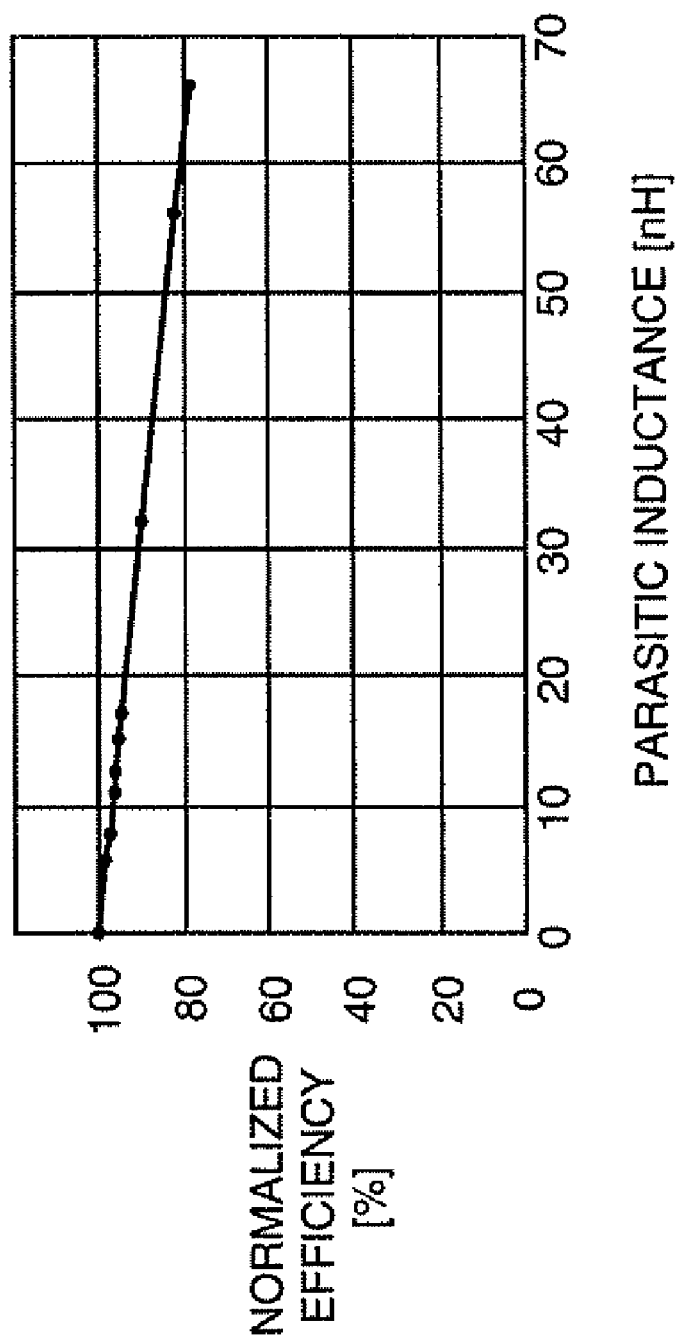
FIG. 5 is an explanatory diagram showing a relationship between the parasitic inductance and normalized efficiency.

FIG. 5 is an explanatory diagram showing a relationship between the parasitic inductance and normalized efficiency. In the drawing, the lateral axis represents the parasitic inductance while the vertical axis represents the normalized efficiency (%). Here, the normalized efficiency denotes the ratio (IP/OP) between the power (the supply power) IP supplied to the semiconductor laser 142 and power (output power) OP output from the DC/DC converter 120 expressed in percentage. For example, if the parasitic inductance is zero, the supply power IP becomes equal to the output power OP, and the normalized efficiency becomes 100%.

As is understood from FIG. 5, the larger the parasitic inductance becomes, the smaller the normalized efficiency becomes. In other words, in order for increasing the normalized efficiency, it is enough to decrease the parasitic inductance. It should be noted that as the parasitic inductance decreases, the integration value ∫I of the current described above increases, and consequently, the supply power IP increases.

Reduction of the parasitic inductance can be achieved by devising the wiring pattern of the drive circuit.

As is widely known to the public, the inductance L (μH) of a loop coil is represented by a formula (1) below. It should be noted that R denotes a radius of the coil (i.e., the loop), and d denotes a diameter of the lead wire. Further, "a" is a constant.

$$L = 4\pi R\left(2.303\log_{10}\frac{16R}{d} - a\right) \cdot 10^{-3} \quad (1)$$

As is understood from the formula (1), by reducing the value of R, the inductance L is decreased. Further, the value of d is increased, the inductance L is also reduced.

In other words, the parasitic inductance caused by the wiring pattern can be reduced by reducing the diameter (distance) of the current loop and increasing the width of the wiring pattern.

It should be noted that the normalized efficiency (FIG. 5) is preferably higher than about 80%, and further preferably higher than about 90%. Alternatively, the parasitic inductance is preferably smaller than about 50 nH, and further preferably smaller than about 30 nH.

A-3. Configuration of Print Circuit Board

FIGS. 6A through 6C are explanatory diagrams showing a configuration of a printed circuit board. In the present embodiment, a rigid type print circuit board (hereinafter referred to as "a rigid circuit board") is used. FIG. 6A shows the obverse surface of the rigid circuit board SA, and FIG. 6C shows the reverse surface of the rigid circuit board SA. FIG. 6B shows a schematic cross-sectional view of the rigid circuit board SA. It should be noted that the circuit surrounded by a dashed line in FIG. 2 is realized by the configuration shown in FIGS. 6A through 6C.

As shown in FIGS. 6A through 6C, the rigid circuit board SA is provided with an insulating plate IA, two patterns PA1, PA2 formed on one side (the obverse surface side) of the insulating plate IA, and two patterns PA3, PA4 formed on the other side (the reverse surface side) of the insulating plate IA. It should be noted that the insulating plate IA is formed, for example, of a glass epoxy board. Further, the both sides of the rigid circuit board SA are coated with a solder resist not shown in the drawings.

On the obverse surface of the rigid circuit board SA, there is mounted the capacitor 128 formed of a plurality of chip capacitors. One terminal of the capacitor 128 is connected to the first pattern PA1, and the other terminal thereof is connected to the second pattern PA2. The voltage at the point Pa of the DC/DC converter 120 shown in FIG. 2 is applied to the first pattern PA1, and the voltage at the point Pb is applied to the second pattern PA2.

On the reverse surface of the rigid circuit board SA, there is mounted the transistor 152. Specifically, the transistor 152 is disposed inside an area in which the third pattern PA3 is formed, when viewed from a direction along the normal line of the rigid circuit board SA. The drain terminal of the transistor 152 is connected to the third pattern PA3, and the gate terminal thereof is connected to the fourth pattern PA4. The gate terminal of the transistor 152 is provided with the light emission control signal CL via the fourth pattern PA4.

It should be noted that the transistor 152 is an N-channel MOSFET, and the housing thereof is the drain terminal. Such a transistor is supplied by, for example, International Rectifier Corporation.

On one side of the rigid circuit board SA, there is disposed the semiconductor laser 142. The anode terminal of the semiconductor laser 142 is connected to the first pattern PA1 on the obverse surface via a conductive sheet CS, and the cathode terminal thereof is connected to the third pattern PA3 on the reverse surface via a conductive sheet CS. As the conductive sheet CS, an indium sheet, for example, can be used.

Further, as shown in FIG. 6B, a via H1 is disposed through the rigid circuit board SA. One end of the via H1 is connected to the second pattern PA2 formed on the obverse surface, and the other end thereof is connected to the source terminal of the transistor 152 mounted on the reverse surface.

As illustrated with arrows in FIGS. 6A through 6C, the current flowing through the semiconductor laser 142 in the forward direction (the forward current) flows through the first pattern PA1 and the third pattern PA3 in this order. Specifically, the direction in which the forward current flows through the first pattern PA1 and the direction in which the forward current flows through the third pattern PA3 are substantially parallel to each other and reverse to each other.

In the present embodiment, the first pattern PA1 and the third pattern PA3 are formed so as to overlap with each other when viewed in the direction along the normal line of the rigid circuit board SA. In other words, the third pattern PA3 is located on the reverse side of the first pattern PA1. Therefore, the loop distance (R in the formula (1)) is substantially the same as the thickness of the rigid circuit board SA. Therefore, since the loop distance is set small in the present embodiment, the parasitic inductance can be made small.

Further, in the present embodiment, the width of the first pattern PA1 and the width of the third pattern PA3 are substantially the same as the width WA of the rigid circuit board SA. Therefore, since the width of the first pattern PA1 and the width of the third pattern PA3 are set large in the present embodiment, the parasitic inductance can be made small.

It should be noted that the width of the pattern denotes the size of the pattern in a direction perpendicular to the direction in which the forward current flows through the pattern.

Further, in the present embodiment, the widths of the two patterns PA1, PA3 are substantially the same. Therefore, the loop distance (R in the formula (1)) can be made smaller in comparison with the case in which the widths of the two patterns PA1, PA3 are different from each other. More specifically, the distance between the end section of the first pattern PA1 in the width direction and the end section of the third pattern PA3 in the width direction can be made smaller. Therefore, the parasitic inductance can be made small.

Figure 7:
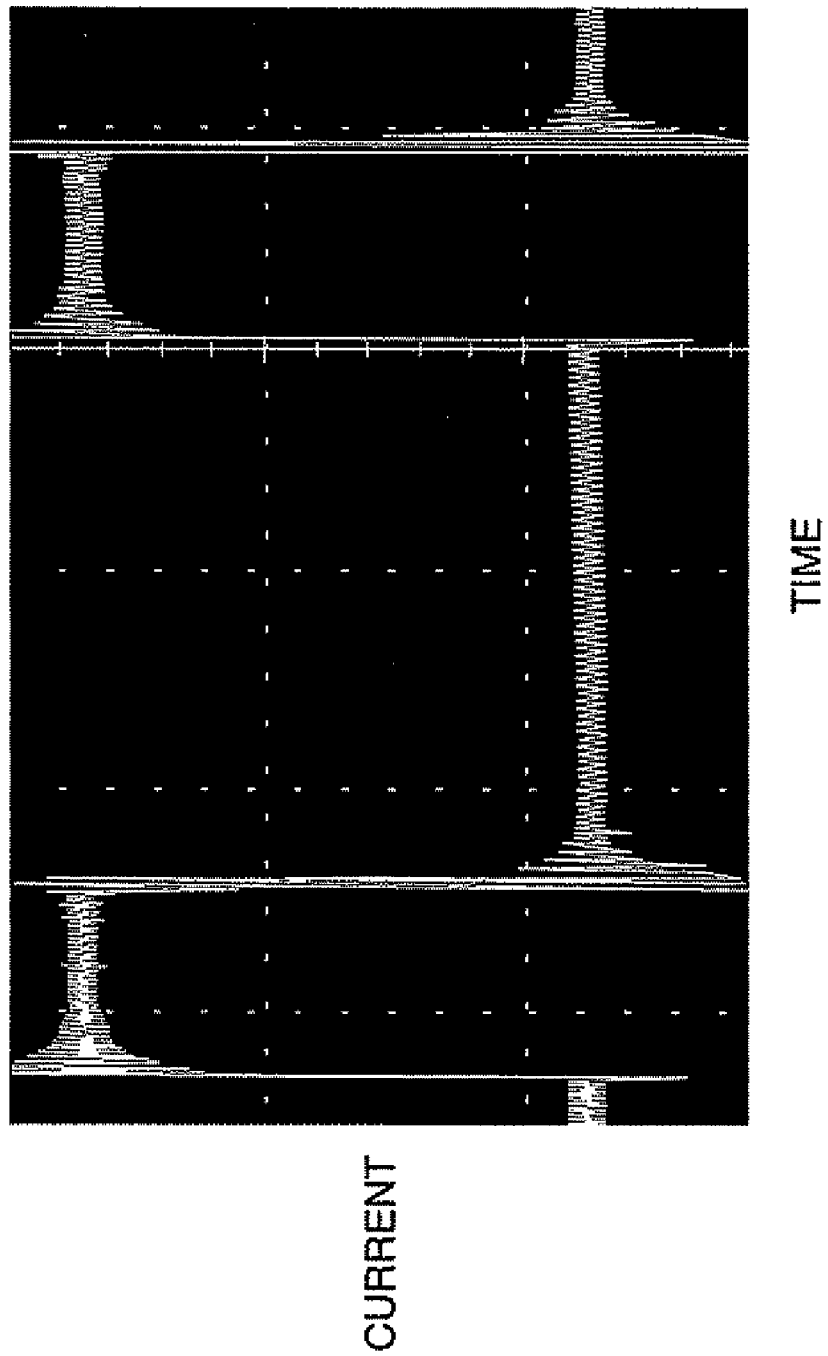
FIG. 7 is an explanatory diagram showing an example of a waveform of a current.

FIG. 7 is an explanatory diagram showing an example of the waveform of the current. By adopting the configuration (FIGS. 6A through 6C) of the present embodiment, the parasitic inductance can be reduced, and as a result, as shown in FIG. 7, it becomes possible to make the current waveform come nearer to the rectangular waveform.

As described above, in the present embodiment, the first pattern PA1 and the third pattern PA3 electrically connected respectively to the anode and the cathode of the semiconductor laser 142 are formed so as to overlap with each other when viewed in the direction along the normal line of the rigid circuit board SA. Therefore, the parasitic inductance of the drive circuit can be reduced, and as a result, it becomes possible to enhance the efficiency of the light source device 100 to reduce the power consumption of the light source device 100.

It should be noted that the first pattern PA1 and the third pattern PA3 in the present embodiment correspond to a first pattern and a second pattern provided to a rigid board in the invention.

Further, in the case in which the parasitic inductance is set to be about 50 nH or smaller, the thickness (i.e., the distance between the patterns PA1, PA3) of the rigid circuit board SA is preferably set to be about 1.2 mm or smaller.

B. Second Embodiment

FIGS. 8A through 8C are diagrams showing a configuration of a printed circuit board in a second embodiment, and correspond to FIGS. 6A through 6C, respectively. The rigid circuit board SA shown in FIGS. 8A through 8C is the same as in FIGS. 6A through 6C. In FIGS. 8A through 8C, there is added a flexible type printed circuit board (hereinafter referred to as "a flexible circuit board") SB. As described above, by using the flexible circuit board SB, the freedom of arrangement of the drive circuit can be enhanced.

As shown in FIGS. 8A through 8C, the flexible circuit board SB is provided with an insulating layer IB, a pattern PB5 formed on one side (the obverse surface side) of the insulating layer IB, and a pattern PB6 formed on the other side (the reverse surface side) of the insulating layer IB. It should be noted that the insulating layer IB is formed, for example, of a polyimide film. Further, on the both sides of the flexible circuit board SB, there are disposed cover layers (e.g., polyimide films) not shown in the drawings.

The fifth pattern PB5 on the obverse surface of the flexible circuit board SB is connected to the first pattern PA1 on the obverse surface of the rigid circuit board SA via a conductive sheet CS. Further, the sixth pattern PB6 on the reverse surface of the flexible circuit board SB is connected to the third pattern PA3 on the reverse surface of the rigid circuit board SA via a conductive sheet CS.

It should be noted that although in the present embodiment, the two patterns (e.g., PA1, PB5) are connected to each other via the conductive sheet CS, they can be connected via a clipping member instead thereof. For example, it is possible that by mechanically clipping the two circuit boards SA, SB with a clip, the two patterns PA1, PB5 on the obverse side are electrically connected to each other via a first clipping surface of the clip, and at the same time, the two patterns PA3, PB6 on the reverse side are electrically connected to each other via a second clipping surface of the clip.

As shown in FIG. 8B, in the present embodiment, the semiconductor laser 142 is disposed on the side of the flexible circuit board SB. The anode terminal of the semiconductor laser 142 is connected to the fifth pattern PB5 on the obverse surface of the flexible circuit board SB via a conductive sheet CS, and the cathode terminal thereof is connected to the sixth pattern PB6 on the reverse surface of the flexible circuit board SB via a conductive sheet CS.

As illustrated with arrows in FIGS. 8A through 8C, the current flowing through the semiconductor laser 142 in the forward direction (the forward current) flows through the first pattern PA1, the fifth pattern PB5, the sixth pattern PB6, and the third pattern PA3 in this order. Specifically, the direction in which the forward current flows through the first and fifth patterns PA1, PB5 and the direction in which the forward current flows through the sixth and third patterns PB6, PA3 are substantially parallel to each other and reverse to each other.

In the present embodiment, similarly to the first embodiment, the first pattern PA1 and the third pattern PA3 are formed so as to overlap with each other when viewed in the direction along the normal line of the rigid circuit board SA. Further, in the present embodiment, the fifth pattern PB5 and the sixth pattern PB6 are formed so as to overlap with each other when viewed in the direction along the normal line of the flexible circuit board SB. Therefore, the loop distance (R in the formula (1)) is substantially the same as the thicknesses of the two circuit boards SA, SB. Therefore, since the current loop distance is set small in the present embodiment, the parasitic inductance can be made small.

Further, in the present embodiment, similarly to the first embodiment, the width of the first pattern PA1 and the width of the third pattern PA3 are substantially the same as the width WA of the rigid circuit board SA. Further, in the present embodiment, the width of the fifth pattern PB5 and the width of the sixth pattern PB6 are substantially the same as the width WB of the flexible circuit board SB. Therefore, since the widths of the four patterns PA1, PA3, PB5, and PB6 are set large in the present embodiment, the parasitic inductance can be made small.

Further, in the present embodiment, similarly to the first embodiment, the widths of the first and third patterns PA1, PA3 are substantially the same. Still further, in the present embodiment, the widths of the fifth and sixth patterns PB5, PB6 are substantially the same. Therefore, the parasitic inductance can be made smaller in comparison with the case in which the widths of the two corresponding patterns (e.g., PB5, PB6) are different from each other.

It should be noted that although in the present embodiment, the thickness of the flexible circuit board SB is substantially the same as the thickness of the rigid circuit board SA, they can be different from each other. For example, it is possible that the thickness of the flexible circuit board SB is set smaller than the thickness of the rigid circuit board SA. Further, although in the present embodiment, the width WB of the flexible circuit board SB is substantially the same as the width WA of the rigid circuit board SA, they can be different from each other. For example, it is possible that the width of the flexible circuit board SB is set larger than the width of the rigid circuit board SA.

As described above, in the present embodiment, similarly to the first embodiment, the first pattern PA1 and the third pattern PA3 electrically connected respectively to the anode and the cathode of the semiconductor laser 142 are formed so as to overlap with each other when viewed in the direction along the normal line of the rigid circuit board SA. Further, in the present embodiment, the fifth pattern PB5 and the sixth pattern PB6 electrically connected respectively to the anode and the cathode of the semiconductor laser 142 are formed so as to overlap with each other when viewed in the direction along the normal line of the flexible circuit board SB. Therefore, the parasitic inductance of the drive circuit can be reduced, and as a result, it becomes possible to enhance the efficiency of the light source device 100 to reduce the power consumption of the light source device 100.

It should be noted that the first pattern PA1 and the third pattern PA3 in the present embodiment correspond to a first pattern and a second pattern provided to a rigid board in the invention. Further, the fifth pattern PB5 and the sixth pattern PB6 in the present embodiment correspond to a third pattern and a fourth pattern provided to a flexible board in the invention.

Alternatively, the fifth pattern PB5 and the sixth pattern PB6 in the present embodiment correspond to a first pattern and a second pattern provided to a flexible board in the invention.

C. Third Embodiment

FIGS. 9A through 9C are diagrams showing a configuration of a printed circuit board in a third embodiment, and correspond to FIGS. 8A through 8C, respectively. In FIGS. 9A through 9C, the rigid circuit board SC and the flexible circuit board SD are modified in conjunction with a change in the arrangement of the transistor 152. It should be noted that since the flexible circuit board SD is used also in the present embodiment similarly to the second embodiment, the freedom of arrangement of the drive circuit can be enhanced.

As shown in FIGS. 9A through 9C, the rigid circuit board SC is provided with an insulating plate IC, two patters PC1, PC2 formed on one side (the obverse surface side) of the insulating plate IC, and a pattern PC3 formed on the other side (the reverse surface side) of the insulating plate IC.

The obverse surface of the rigid circuit board SC is the same as shown in FIGS. 8A through 8C. It should be noted that in contrast to the case shown in FIGS. 8A through 8C, the transistor 152 is not mounted on the reverse surface of the rigid circuit board SC. Further, as shown in FIG. 9B, a via H2 is disposed through the rigid circuit board SC. One end of the via H2 is connected to the second pattern PC2 formed on the obverse surface, and the other end thereof is connected to the third pattern PC3 formed on the reverse surface.

As shown in FIGS. 9A through 9C, the flexible circuit board SD is provided with an insulating layer ID, a pattern PD4 formed on one side (the obverse surface side) of the insulating layer ID, three patterns PD5, PD6, and PD7 formed on the other side (the reverse surface side) of the insulating layer ID, and a pattern PD8 formed inside the insulating layer ID. It should be noted that although not shown in FIGS. 9A through 9C, the width of the eighth pattern PD8 is set to be substantially equal to the width WD of the flexible circuit board SD.

The obverse surface of the flexible circuit board SD is the same as shown in FIGS. 8A through 8C. In contrast to the case shown in FIGS. 8A through 8C, the transistor 152 is mounted on the reverse surface of the flexible circuit board SD. Specifically, the transistor 152 is disposed inside an area in which the fifth pattern PD5 is formed, when viewed from a direction along the normal line of the flexible circuit board SD. The drain terminal of the transistor 152 is connected to the fifth pattern PD5, and the gate terminal thereof is connected to the seventh pattern PD7.

Further, as shown in FIG. 9B, vias H3, H4 are disposed through the flexible circuit board SD. One end of the via H3 is connected to the eighth pattern PD8 formed inside the insulating layer ID, and the other end thereof is connected to the source terminal of the transistor 152 mounted on the reverse surface. Further, one end of the via H4 is connected to the eighth pattern PD8 formed inside the insulating layer ID, and the other end thereof is connected to the sixth pattern PD6 formed on the reverse surface.

The fourth pattern PD4 on the obverse surface of the flexible circuit board SD is connected to the first pattern PC1 on the obverse surface of the rigid circuit board SC via a conductive sheet CS. Further, the sixth pattern PD6 on the reverse surface of the flexible circuit board SD is connected to the third pattern PC3 on the reverse surface of the rigid circuit board SC via a conductive sheet CS.

It should be noted that although in the present embodiment, the two patterns (e.g., PC1, PD4) are connected to each other via the conductive sheet CS, they can be connected via a clipping member instead thereof as explained in the second embodiment.

As shown in FIG. 9B, the semiconductor laser 142 is disposed on the side of the flexible circuit board SD. The anode terminal of the semiconductor laser 142 is connected to the fourth pattern PD4 on the obverse surface of the flexible circuit board SD via a conductive sheet CS, and the cathode terminal thereof is connected to the fifth pattern PD5 on the reverse surface of the flexible circuit board SD via a conductive sheet CS.

As illustrated with arrows in FIGS. 9A through 9C, the current flowing through the semiconductor laser 142 in the forward direction (the forward current) flows through the first pattern PC1, the fourth pattern PD4, the fifth pattern PD5, the eighth pattern PD8, the sixth pattern PD6, and the third pattern PC3 in this order. Specifically, the direction in which the forward current flows through the first and fourth patterns PC1, PD4 and the direction in which the forward current flows through the fifth, eighth, sixth and third patterns PD5, PD8, PD6, and PC3 are substantially parallel to each other and reverse to each other.

In the present embodiment, the first pattern PC1 and the third pattern PC3 are formed so as to overlap with each other when viewed in the direction along the normal line of the rigid circuit board SC. Further, in the present embodiment, the fourth pattern PD4 and the fifth, sixth, and eighth patterns PD5, PD6, and PD8 are formed so that the fourth pattern PD4 overlaps the fifth, sixth, and eighth patterns PD5, PD6, and PD8 when viewed in a direction along the normal line of the flexible circuit board SD. Therefore, the loop distance (R in the formula (1)) is substantially the same as the thicknesses of the two circuit boards SC, SD. Therefore, since the current loop distance is set small in the present embodiment, the parasitic inductance can be made small.

Further, in the present embodiment, the width of the first pattern PC1 and the width of the third pattern PC3 are substantially the same as the width WC of the rigid circuit board SC. Further, in the present embodiment, the width of the fourth pattern PD4, the widths of the fifth, sixth, and eighth patterns PD5, PD6, and PD8 are substantially the same as the width WD of the flexible circuit board SD. Therefore, since the widths of the six patterns PC1, PC3, PD4, PD5, PD6, and PD8 are set large in the present embodiment, the parasitic inductance can be made small.

Further, in the present embodiment, the widths of the first and third patterns PC1, PC3 are substantially the same. Still further, in the present embodiment, the widths of the fourth, fifth, sixth, and eighth patterns PD3, PD5, PD6, and PD8 are substantially the same. Therefore, the parasitic inductance can be made smaller in comparison with the case in which the widths of the two corresponding patterns (e.g., PD4, PD5) are different from each other.

It should be noted that although in the present embodiment, the thickness of the flexible circuit board SD is substantially the same as the thickness of the rigid circuit board SC, they can be different from each other. For example, it is possible that the thickness of the flexible circuit board SD is set smaller than the thickness of the rigid circuit board SC. Further, although in the present embodiment, the width WD of the flexible circuit board SD is substantially the same as the width WC of the rigid circuit board SC, they can be different from each other. For example, it is possible that the width of the flexible circuit board SD is set larger than the width of the rigid circuit board SC.

As described above, in the present embodiment, the fourth pattern PD4 and the fifth pattern PD5 electrically connected respectively to the anode and the cathode of the semiconductor laser 142 are formed so as to overlap with each other when viewed in the direction along the normal line of the flexible circuit board SD. Therefore, the parasitic inductance of the drive circuit can be reduced, and as a result, it becomes possible to enhance the efficiency of the light source device 100 to reduce the power consumption of the light source device 100.

It should be noted that the fourth pattern PD4 and the fifth pattern PD5 in the present embodiment correspond to a first pattern and a second pattern provided to a flexible board in the invention.

C-1. Modified Example of Third Embodiment

Figure 10:
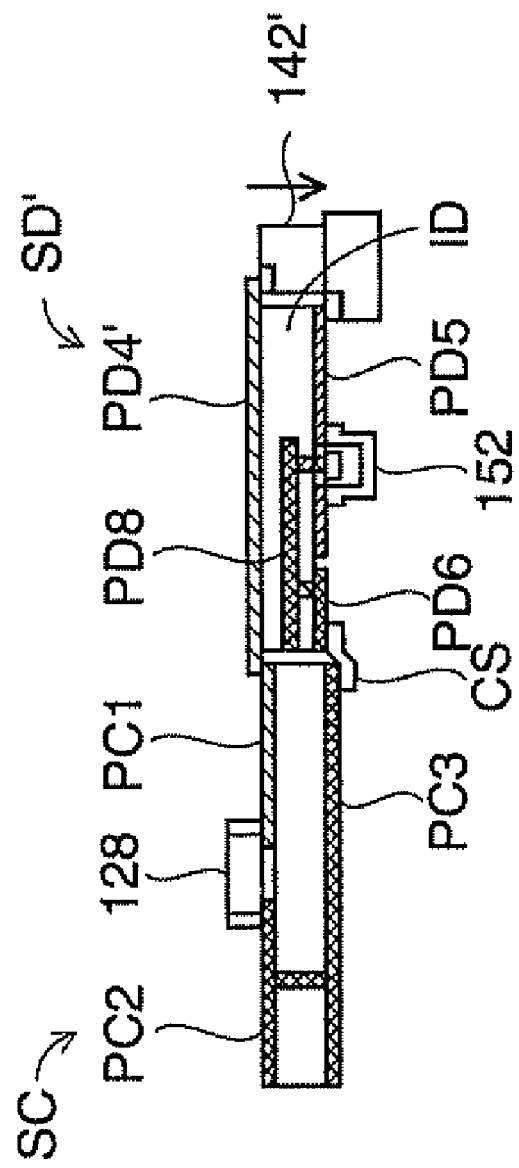
FIG. 10 is an explanatory diagram showing a configuration of a printed circuit board in a modified example of the third embodiment of the invention.

FIG. 10 is an explanatory diagram showing a configuration of a printed circuit board in a modified example of the third embodiment of the invention. FIG. 10 is substantially the same as FIG. 9B with an exception of a modified flexible circuit board SD'.

As shown in FIG. 10, in the present example, the size of the fourth pattern PD4' provided on the obverse surface of the flexible circuit board SD' is changed. Specifically, the length of the fourth pattern PD4' is set larger, and in the drawing, the right end of the fourth pattern PD4' protrudes rightward from the insulating layer ID, and the left end of the fourth pattern PD4' protrudes leftward from the insulating layer ID.

The fourth pattern PD4' is connected to the first pattern PC1 on the obverse surface of the rigid circuit board SC by soldering. It should be noted that similarly to the third embodiment, the sixth pattern PD6 is connected to the third pattern PC3 on the reverse surface of the rigid circuit board SC via a conductive sheet CS.

Further, in the present example, the semiconductor laser 142' is modified. The semiconductor laser 142' of the present example has an outer shape formed by combining two cubes. Further, in the present example, two pads respectively forming the anode terminal and the cathode terminal of the semiconductor laser 142' are both formed on a surface facing to one side (the surface facing upward in the drawing). Still further, the anode terminal of the semiconductor laser 142' is connected to the fourth pattern PD4' by soldering, while the cathode terminal is connected to the fifth pattern PD5 by soldering.

D. Application Examples of Light Source Device

Figure 11:
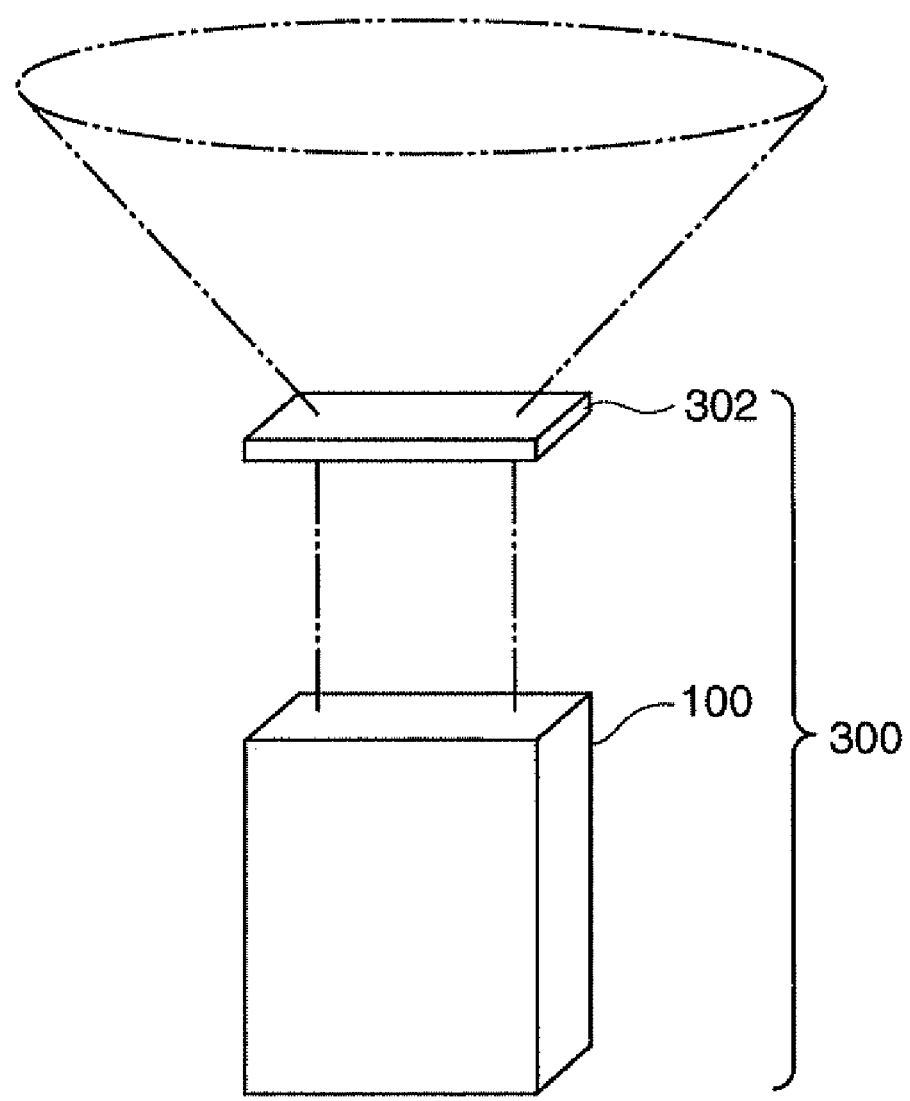
FIG. 11 is an explanatory diagram showing a lighting device 300 as a first application example of the light source device 100.

FIG. 11 is an explanatory diagram showing a lighting device 300 as a first application example of the light source device 100. As shown in the drawing, the lighting device 300 is provided with the light source device 100 described above and a diffusing plate 302 for diffusing a laser beam emitted from the light source device 100.

Since the lighting device 300 is equipped with the light source device 100 described above, it becomes possible to enhance the efficiency of the lighting device 300, thus reducing the power consumption.

Figure 12:
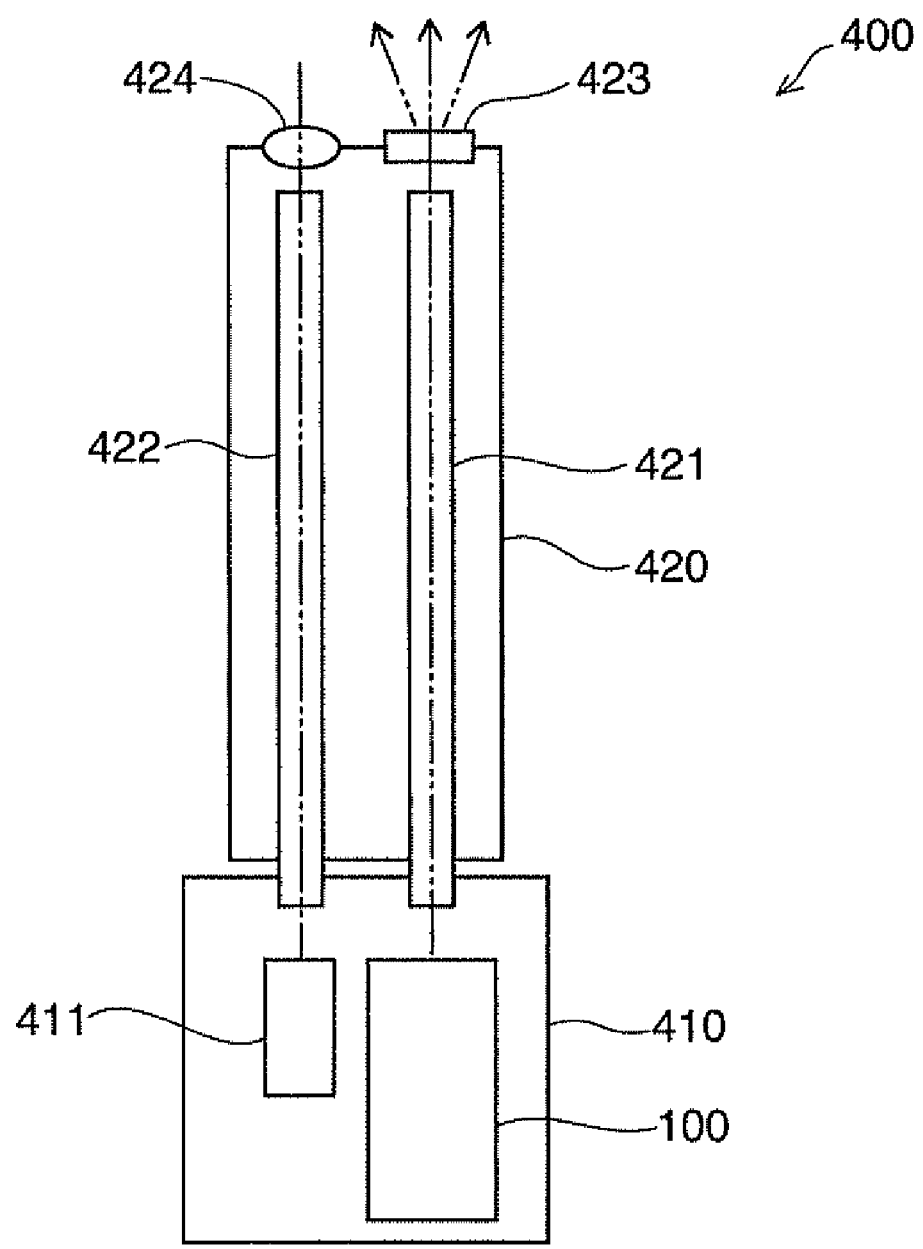
FIG. 12 is an explanatory diagram showing a monitor device 400 as a second application example of the light source device 100.

FIG. 12 is an explanatory diagram showing a monitor device 400 as a second application example of the light source device 100. As shown in the drawing, the monitor device 400 is provided with a device main body 410 and an optical transmission section 420. The device main body 410 is provided with the light source device 100 described above and a camera 411.

The light transmission section 420 is provided with two light guides 421, 422, a diffusing plate 423, and a lens 424. Each of the light guides 421, 422 is formed of a bundle of a number of optical fibers. The laser beam emitted from the light source device 100 is guided by the first light guide 421 to enter the diffusing plate 423. The light diffused by the diffusing plate 423 illuminates the object. The light reflected by the object enters the second light guide 422 via the lens 424. The light, which has entered the second light guide 422, is guided to the camera 411. Thus, the object is shot by the camera 411.

Since the monitor device 400 is equipped with the light source device 100 described above, it becomes possible to enhance the efficiency of the monitor device 400, thus reducing the power consumption. It should be noted that the camera 411 shown in FIG. 12 corresponds to an imaging section in the invention.

Figure 13:
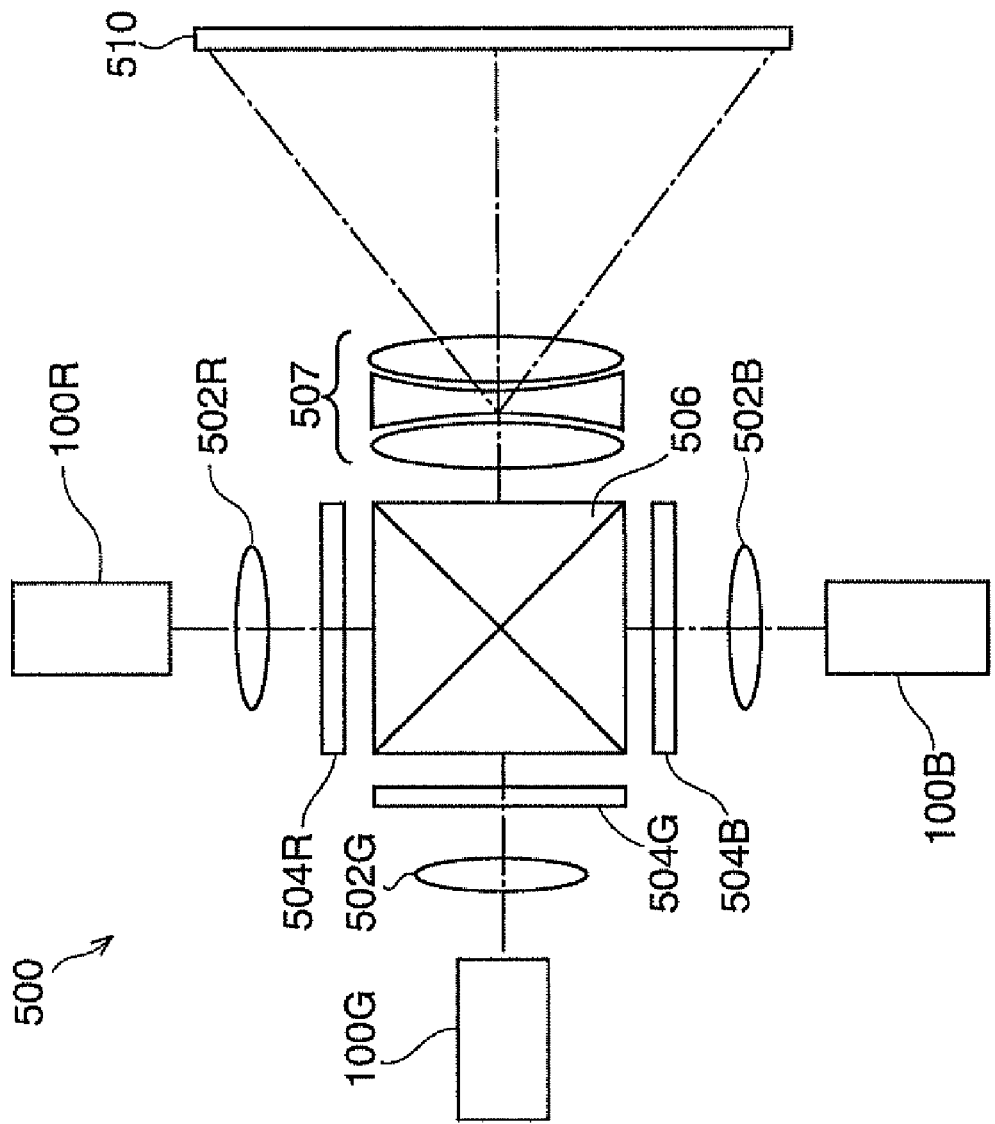
FIG. 13 is an explanatory diagram showing a schematic configuration of a projector 500 as a third application example of the light source device 100.

FIG. 13 is an explanatory diagram showing a schematic configuration of a projector 500 as a third application example of the light source device 100. As shown in the drawing, the projector 500 is provided with three light source devices 100R, 100G, and 100B, three equalizing optical systems 502R, 502G, and 502B, three liquid crystal light valves 504R, 504G, and 504B, a cross dichroic prism 506, and a projection lens 507.

The three light source devices 100R, 100G, and 100B each have substantially the same configuration as that of the light source device 100 described above. It should be noted that the first light source device 100R emits a red laser beam. The second light source device 100G emits a green laser beam. The third light source device 100B emits a blue laser beam. Further, the wavelength of the laser beam is changed by changing the semiconductor laser 142, the wavelength conversion element 144, or both of the semiconductor laser 142 and the wavelength conversion element 144 in the light source device 100.

The equalizing optical systems 502R, 502G, and 502B equalize the illumination distributions of the light beams emitted from the corresponding light source devices 100R, 100G, and 100B, respectively. For example, the equalizing optical systems 502R, 502G, and 502B are each formed of a hologram or a field lens. The liquid crystal light valves 504R, 504G, 504B respectively modulate the light beams emitted from the corresponding equalizing optical systems 502R, 502G, 502B in accordance with image information. The cross dichroic prism (a color combining section) 506 combines the three modulated light beams emitted from the three liquid crystal light valves 504R, 504G, 504B. The projection lens 507 projects the light combined by the cross dichroic prism 506 on a screen 510. As a result, a color image is displayed on the screen 510.

Since the projector 500 is equipped with the light source devices 100R, 100G, and 100B substantially the same as the light source device 100 described above, it becomes possible to enhance the efficiency of the projector 500, thus reducing the power consumption. It should be noted that the liquid crystal light valves shown in FIG. 13 correspond to light modulation devices in the invention.

Although in FIG. 13, the projector 500 is provided with the liquid crystal light valves as the light modulation devices, it is possible that the projector 500 is provided with micromirror type light modulation devices such as digital micromirror devices (DMD, a trademark of Texas Instruments) instead thereof. Further, although the projector 500 is shown as the third application example of the light source device 100 in FIG. 13, the light source device can generally be applied to the image display devices.

It should be noted that the invention is not limited to the specific examples and the embodiments described above, but can be put into practice in various forms within the scope or the spirit of the invention, and the following modifications, for example, are also possible.

1. Although in the first embodiment the semiconductor laser 142 is disposed on the side of the rigid circuit board SA, the semiconductor laser 142 can also be mounted on the obverse surface side or the reverse surface side of the rigid circuit board instead thereof. Similarly, although in the second and third embodiments the semiconductor laser 142 is disposed on the sides of the respective flexible circuit boards SB, SD, the semiconductor laser 142 can also be mounted on the obverse surface side or the reverse surface side of the flexible circuit board instead thereof. It should be noted that, as shown in the embodiments described above, in the case in which the semiconductor laser 142 is disposed on the side of the circuit board, the radius of the current loop in the vicinity of the semiconductor laser 142 can be made smaller in comparison with the case in which the semiconductor laser 142 is disposed on the obverse surface or the reverse surface of the circuit board, and as a result, there can be obtained an advantage that the parasitic inductance can be reduced.

2. In the embodiment described above, the pattern connected to the anode of the semiconductor laser 142 is formed on the obverse surface side (the obverse layer) of each of the circuit boards SA, SB, and SD, and the pattern connected to the cathode of the semiconductor laser 142 is formed on the reverse surface side (the reverse layer) of each of the circuit boards SA, SB, and SD. However, in the case in which a multilayer circuit board is used for the circuit board, at least one of the pattern connected to the anode and the pattern connected to the cathode can be formed in the layer inside the circuit board.

In general, it is enough that the first pattern electrically connected to the anode of the semiconductor light emitting element and the second pattern electrically connected to the cathode of the semiconductor light emitting element are formed in the different layers of the circuit board, and overlap with each other when viewed in the direction along the normal line of the circuit board.

3. Although in the embodiments described above, the light source device 100 executes the APC control, it is also possible to eliminate execution of the APC control. In such a case, the detecting mirror 172, the photo diode 174, and the current/voltage conversion circuit 176 can be eliminated.

4. Although in the embodiments described above, the light source device 100 is provided with the semiconductor laser 142 for emitting an infrared light beam, the wavelength conversion element 144, and the mirror 146, it is possible to provide a semiconductor laser for emitting a light beam with a desired wavelength instead thereof. In such a case, the wavelength conversion element 144 can be eliminated.

5. Although the light source device 100 is provided with the semiconductor laser 142 in the embodiments described above, it is possible to provide a light emitting diode (LED) instead thereof. In general, it is enough for the drive circuit to drive the semiconductor light emitting element.

6. In the embodiments described above, it is possible to replace a part of the configuration realized by hardware with software, or to replace a part of the configuration realized by software with hardware.

The entire disclosure of Japanese Patent Application No. 2007-226388, filed Aug. 31, 2007 is expressly incorporated by reference herein.

What is claimed is:

1. A drive circuit for driving a semiconductor light emitting element, comprising:
    a rigid board having a first surface and a second surface that is opposite to the first surface;
    a first pattern formed in a first layer of the rigid board so as to be electrically connected to an anode of the semiconductor light emitting element, the first pattern being formed on the first surface;
    a second pattern formed in a second layer of the rigid board so as to be electrically connected to a cathode of the semiconductor light emitting element, the second pattern being formed on the second surface;
    a flexible board;
    a third pattern formed in a third layer of the flexible board, and through which the first pattern and the anode are to be electrically connected to each other; and
    a fourth pattern formed in a fourth layer of the flexible board, and through which the second pattern and the cathode are to be electrically connected to each other,
    wherein the first pattern and the second pattern are formed so as to overlap with each other when viewed in a direction along a normal line of the rigid board,
    the third pattern and the fourth pattern are formed so as to overlap with each other when viewed in a direction along a normal line of the flexible board, and
    a width of the first pattern and a width of the second pattern are substantially the same, and the width of the first pattern and the width of the second pattern are substantially the same as a width of the rigid board.

2. The drive circuit according to claim 1,
    wherein a first direction in which a current flowing through the semiconductor light emitting element flows through the first pattern and a second direction in which the current flows through the second pattern are reverse to each other.

3. The drive circuit according to claim 1,
    wherein the semiconductor light emitting element is allowed to be disposed on a side of the rigid board.

4. The drive circuit according to claim 1,
    wherein a width of the third pattern and a width of the fourth pattern are substantially the same.

5. The drive circuit according to claim 1,
    wherein a third direction in which a current flowing through the semiconductor light emitting element flows through the third pattern and a fourth direction in which the current flows through the fourth pattern are reverse to each other.

6. The drive circuit according to claim 1,
    wherein the semiconductor light emitting element is allowed to be disposed on a side of the flexible board.

7. The drive circuit according to claim 1, further comprising:
    a switching element to be connected to the semiconductor light emitting element,
    wherein the switching element is disposed inside an area in which the second pattern is formed.

8. The drive circuit according to claim 1,
    wherein the rigid board is formed of a flexible board.

9. The drive circuit according to claim 8, wherein the semiconductor light emitting element is allowed to be disposed on a side of the flexible board.

10. The drive circuit according to claim 8, further comprising:
a switching element to be connected to the semiconductor light emitting element,
wherein the switching element is disposed inside an area in which the second pattern is formed.

11. A light source device comprising:
the drive circuit according to claim 1; and
the semiconductor light emitting element.

12. A lighting device comprising:
the light source device according to claim 11.

13. A monitor device comprising:
the light source device according to claim 11; and
an imaging section for shooting an object lighted by the light source device.

14. An image display device comprising:
the light source device according to claim 11; and
a light modulation device for modulating the light emitted from the light source device in accordance with image information.

15. The drive circuit according to claim 1, wherein the semiconductor light emitting element is disposed on an end of the rigid board.

* * * * *